(12) United States Patent
Rector

(10) Patent No.: US 7,494,386 B2
(45) Date of Patent: Feb. 24, 2009

(54) ELECTRICALLY CONDUCTIVE ATTACHMENT DEVICE

(75) Inventor: Robert M. Rector, San Diego, CA (US)

(73) Assignee: Keragis Corporation, Poway, CA (US)

( * ) Notice: Subject to any disclaimer, the term of this patent is extended or adjusted under 35 U.S.C. 154(b) by 145 days.

(21) Appl. No.: 11/448,625

(22) Filed: Jun. 6, 2006

(65) Prior Publication Data

US 2007/0279128 A1  Dec. 6, 2007

(51) Int. Cl.
*H01R 11/09* (2006.01)
(52) U.S. Cl. ..................................... 439/784
(58) Field of Classification Search ............. 439/581, 439/578–585, 784
See application file for complete search history.

(56) References Cited

U.S. PATENT DOCUMENTS

| | | | |
|---|---|---|---|
| 4,724,400 A | 2/1988 | Luettgenau | |
| 5,159,290 A | 10/1992 | Bartley et al. | |
| 5,218,322 A | 6/1993 | Allison et al. | |
| 5,329,248 A | 7/1994 | Izadian | |
| 5,497,050 A | 3/1996 | Cheo | |
| 5,631,446 A | 5/1997 | Quan | |
| 5,801,598 A | 9/1998 | Tantawi et al. | |
| 6,037,840 A | 3/2000 | Myer | |
| 6,198,284 B1 | 3/2001 | Doty | |
| 6,344,777 B1 | 2/2002 | Ingram et al. | |
| 6,708,123 B2 | 3/2004 | Gerrish | |
| 6,724,261 B2 | 4/2004 | Cheo | |
| 2004/0038587 A1* | 2/2004 | Yeung et al. | 439/581 |

FOREIGN PATENT DOCUMENTS

JP   11-261352   9/1999

OTHER PUBLICATIONS

Office Action issued on Apr. 21, 2008 for U.S. Appl. No. 11/448,624 (see file wrapper).
International Search Report and Written Opinion dated Mar. 5, 2008 for PCT Application No. PCT/US2007/013399.

* cited by examiner

*Primary Examiner*—Ross N Gushi
(74) *Attorney, Agent, or Firm*—Knobbe Martens Olson & Bear LLP

(57) ABSTRACT

A power amplifier (power amplifier) having multiple solid state sub-amplifiers connected in parallel between the power amplifier input and the power amplifier output are described. The signal input to the power amplifier is provided to an RF splitter connected between the power amplifier input connector and the input of each of the sub-amplifiers The RF splitter splits the input power from the signal input and provides the power to the sub-amplifier inputs through input electrical paths. The input electrical paths from the power amplifier input to the sub-amplifiers are substantially physically identical. Each of the sub-amplifiers drive an input of an RF combiner connected between the outputs of the sub-amplifiers and the output of the power amplifier. The RF combiner combines the output power from each of the sub-amplifiers through output electrical paths, and provides the combined power to the power amplifier output. The output electrical paths from the sub-amplifiers to the power amplifier output are substantially physically identical.

17 Claims, 10 Drawing Sheets

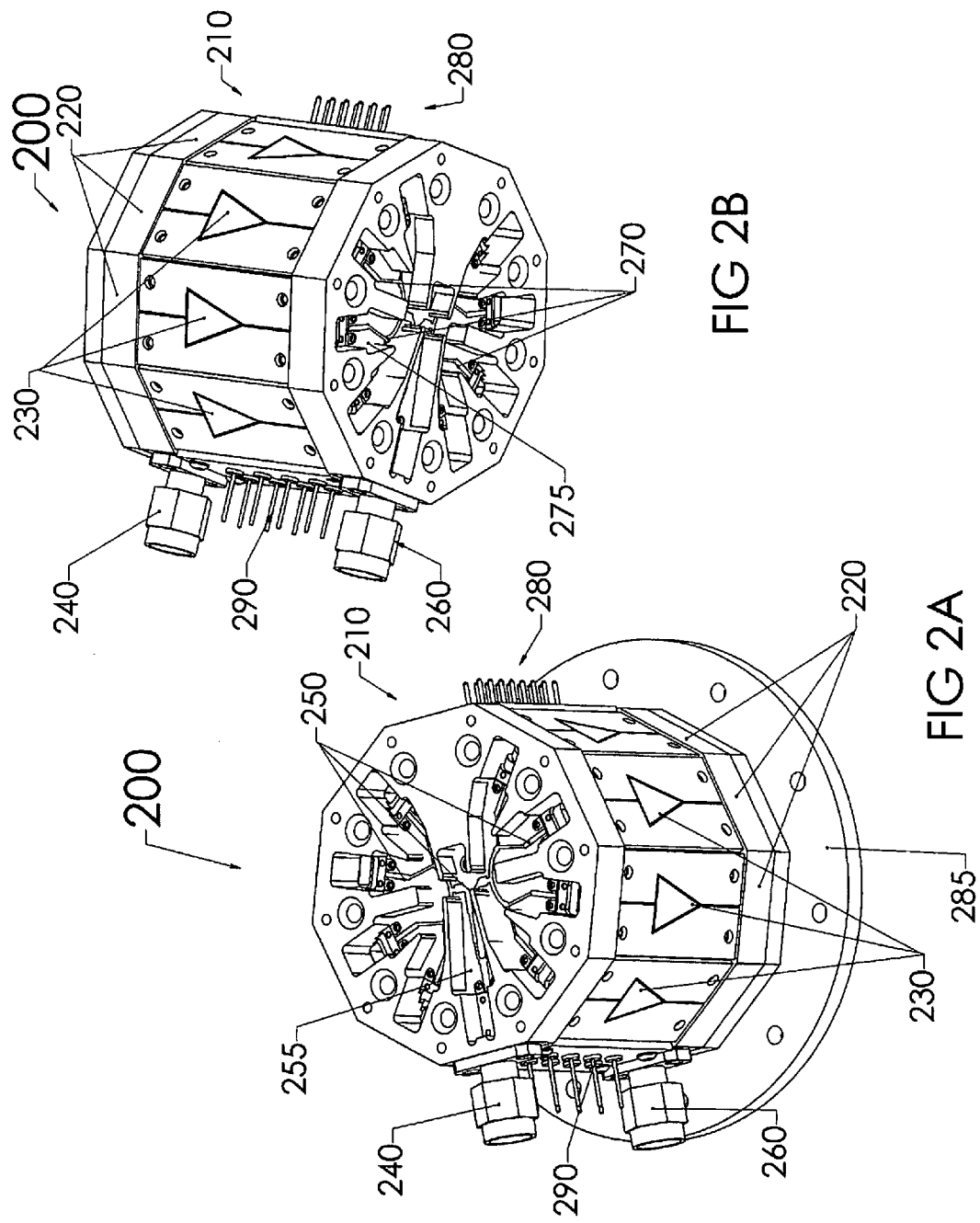

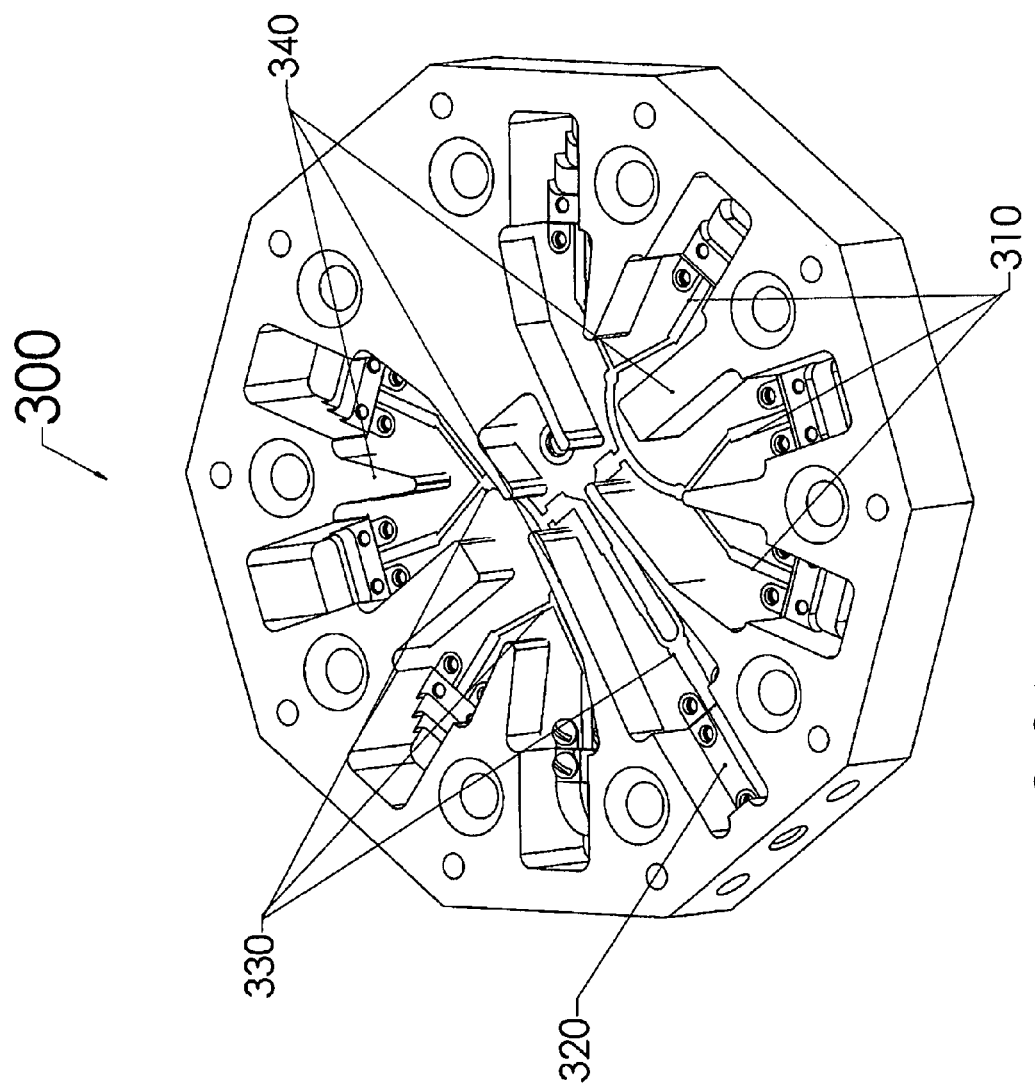

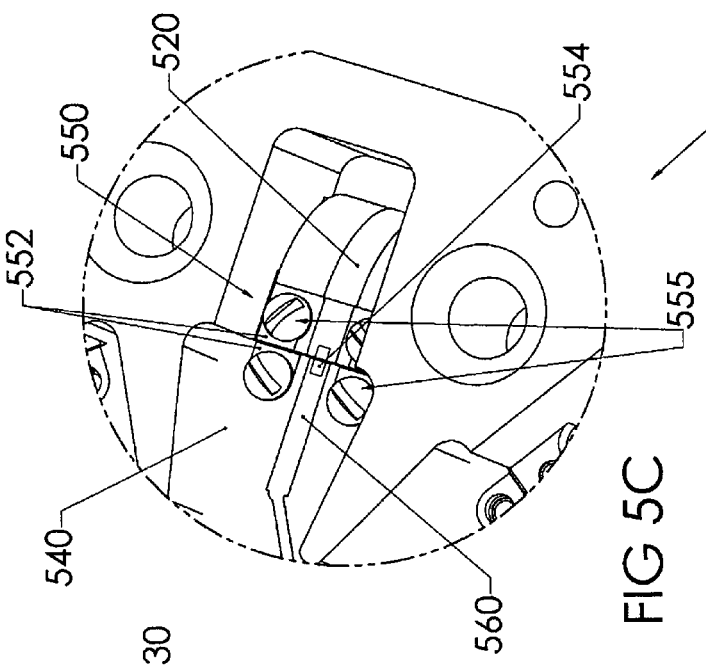
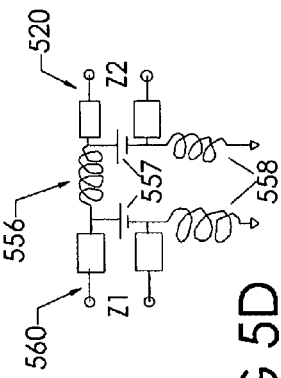
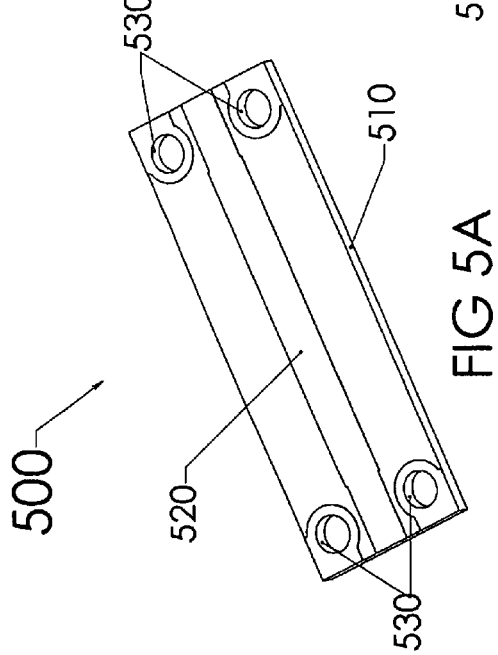
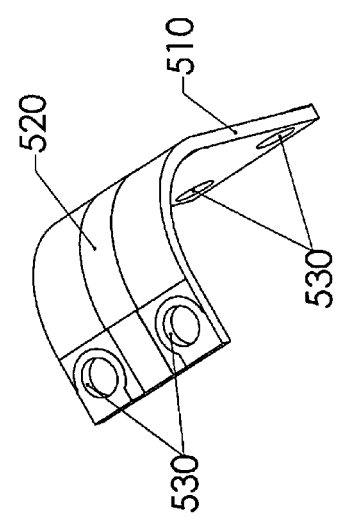
FIG 5A
FIG 5B
FIG 5C
FIG 5D

ELECTRICALLY CONDUCTIVE ATTACHMENT DEVICE

CROSS-REFERENCE TO RELATED APPLICATIONS

This application is related to U.S. application Ser. No. 11/448,624 entitled "Solid State RF Power Amplifier," U.S. application Ser. No. 11/448,623 entitled "Microwave Load," U.S. application Ser. No. 11/448,622 entitled "Flexible Microwave Transmission Line," U.S. application Ser. No. 11/448,626 entitled "Microwave Combiner/Splitter," all of which are filed concurrently herewith, and are incorporated by reference in their entirety.

BACKGROUND

1. Field of the Invention

The field of the invention relates to radio frequency (RF) power amplifiers, and more particularly to a high power, wideband microwave or millimeterwave solid state RF power amplifier that will replace functions where tube type amplifiers have generally been the only choice. The invention relates to a high power, wideband solid state amplifier in a small package that additionally solves the problems of improved efficiency and heat extraction from the amplifier housing.

2. Description of the Related Technology

Microwave and millimeterwave RF power amplifiers are used in various applications, such as in transmitters for communication systems. Transmitters typically process information to generate an RF signal at a low power and apply the low power signal to an RF power amplifier which outputs a high power RF signal. The high power RF signal can be applied to an antenna which broadcasts the signal with the information to one or more distant or local receivers, such as can be found in a radio.

Current solid state RF power amplifiers are limited in their ability to efficiently operate at microwave and millimeterwave frequencies, with a wide bandwidth and at high power. Thus, there is a need for improved solid state power amplifiers.

SUMMARY OF CERTAIN EMBODIMENTS

One embodiment is a transmission line component for an RF power amplifier, including a flexible first substrate, and a first conductor on the first substrate. The first conductor is configured to provide an insertion loss of less than about 0.2 dB when the flexible substrate has a bend of about 90 degrees with a radius of curvature less than about ⅛ inch.

Another embodiment is an RF power amplifier, including an RF input connection, an RF output connection, at least three sub-amplifier modules, a plurality of input electrical paths connecting each of the sub-amplifier modules to the input connection. At least a portion of each of the plurality of input electrical paths collectively and substantially define an input path plane. The power amplifier also includes a plurality of output electrical paths connecting each of the sub-amplifier modules to the output connection, where at least a portion of each of the plurality of output electrical paths collectively and substantially define an output path plane, and where the electrical paths of at least one of the plurality of input electrical paths and the plurality of output electrical paths are substantially identical, and at least one of the input connection and the output connection is substantially parallel to at least one of the input path plane and the output path plane.

Another embodiment is an RF power amplifier, including an RF input connection, an RF output connection, and at least two substantially parallel sub-amplifier modules, where the RF input connection, and the RF output connection are substantially perpendicular to the sub-amplifier modules.

Another embodiment is a method of using an RF power amplifier. The method includes applying an RF input signal to the power amplifier in a first direction, amplifying the power of the RF input signal in a second direction with a plurality of sub-amplifier modules within the power amplifier so as to generate a power amplified RF output signal, where the second direction is substantially perpendicular to the first direction. The method also includes receiving the power amplified RF output signal from the power amplifier in a third direction, the third direction being substantially parallel to the first direction.

Another embodiment is an RF combiner including a plurality of RF input signal paths, at least one RF output signal path, where the output signal path and each of the plurality of input signal paths are positioned substantially within a plane. The RF combiner also includes a plurality of sidewalls, where each input signal path is positioned between at least two sidewalls, and the sidewalls and the plurality of input signal paths are configured such that each of the input paths are physically and electrically substantially identical.

Another embodiment is an RF combiner including a plurality of RF input signal paths, where the plurality of input signal paths includes an e-field compensator, configured to compensate for an input signal path asymmetry.

Another embodiment is an RF combiner including a plurality of RF input signal paths, where the plurality of input signal paths includes a circular current spreader.

Another embodiment is an attachment device for an electrical component including a threaded securing element configured to mechanically attach a first electrical component to a second electrical component, and a first electrical conductor configured to provide an electrical connection from the first electrical component to the second electrical component.

Another embodiment is an RF power amplifier, including a housing, an RF input connection on the housing, and an RF output connection on the housing, where the input and output connections are substantially on the same side of the housing.

Another embodiment is an RF load including a resistive material, and first and second terminals, each terminal including a curved interface to the resistive material.

BRIEF DESCRIPTION OF THE DRAWINGS

FIGS. 2A and 2B are exploded perspective views of an example of a power amplifier.

FIGS. 5A and 5B are illustrations of perspective views of one embodiment of a flexible transmission line.

FIG. 5C is a diagram illustrating a connection between a transmission line and the transmission line of FIGS. 5A and 5B.

FIG. 5D is a schematic diagram illustrating the matching network of the connection of FIG. 5C.

DETAILED DESCRIPTION OF CERTAIN EMBODIMENTS

The following detailed description of certain embodiments presents various descriptions of specific embodiments of the invention. However, the invention can be embodied in a multitude of different ways as defined and covered by the claims. In this description, reference is made to the drawings wherein like parts are designated with like numerals throughout.

The terminology used in the description presented herein is not intended to be interpreted in any limited or restrictive manner, simply because it is being utilized in conjunction with a detailed description of certain specific embodiments of the invention. Furthermore, embodiments of the invention can include several novel features, no single one of which is solely responsible for its desirable attributes or which is essential to practicing the inventions herein described.

Figure 1:
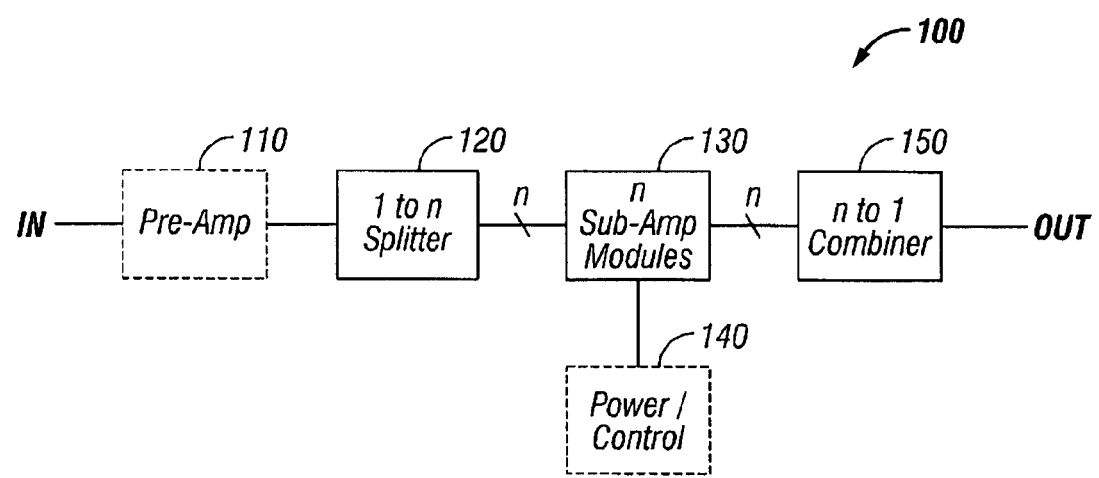
FIG. 1 is a block diagram of an embodiment of power amplifier.

Embodiments of a non-planar power amplifier having multiple solid state sub-amplifier modules connected in parallel between the power amplifier input and the power amplifier output are described. Such power amplifiers can be used in applications such as in transmitters for communication applications which output high power signals. Combinations of these amplifiers can be placed together to provide outputs in the thousands of watts. The parallel arrangement provides desired power amplification. The non-planar design allows for the signal paths between the sub-amplifier modules and the input and the output of the power amplifier to be substantially identical (e.g. same length, shape, width, thickness, surrounding structures, voltages, currents, electrical fields, and/or other characteristics). FIG. 1 is a block diagram of an embodiment of power amplifier 100. Power amplifier 100 includes an optional pre-amp 110, which is an input driver amplifier, a 1-to-n splitter 120, n sub-amplifier modules 130, an optional power/control module 140, and a n-to-1 combiner 150.

Pre-amp 110 receives an input signal and drives the n sub-amplifier modules 130 through splitter 120. In some embodiments, pre-amp 110 functions as a buffer, presenting a small input load, and driving the larger load of the splitter 120 parasitics and the n sub-amplifier module 130 load. In some embodiments pre-amp 110 can perform other functions. For example, pre-amp 110 can perform processing functions, such as filtering the input signal or up-converting the input signal to, for example, an RF transmission frequency. Some embodiments do not have pre-amp 110.

Splitter 120 is configured to split the power from the input signal, and provide substantially equal power and phase shift through input electrical paths to each of the n sub-amplifier modules 130. Splitter 120 provides substantially equal power and phase shift through its input electrical paths by providing each path with substantially identical geometries and physical characteristics. The substantially identical geometries and physical characteristics result in the electrical characteristics of the paths being substantially identical. For example, an input signal with 0 dBm of power can be provided to splitter 120, which then provides 1/8 of the power to each of 8 sub-amplifier modules less combiner losses.

The n sub-amplifier modules 130 include an array of n sub-amplifier modules, electrically connected in parallel. The quantity n can be any number. In certain embodiments, n is an even number. The quantity n is determined at least by the power amplification desired and the power amplification of each sub-amplifier module.

Power/control module 140 provides power and, in some embodiments, control signals to the n sub-amplifier modules. Power/control module 140 is configured to provide substantially identical power and control signals to each of the sub-amplifier modules with n power and control signal paths each substantially identical to the others. In some embodiments, power/control module 140 has power conditioning circuitry, such as a filter and a load sensor.

Combiner 150 is configured to combine the power from each of the sub-amplifier modules 130 through output electrical paths with substantially equal power and phase shift, and provide the combined power to the output. Combiner 150 provides substantially equal power and phase shift through its output electrical paths by providing each path with substantially identical geometries and physical characteristics. For example, output signals with 40 dBm of power each, can be provided to combiner 150, which then provides 8 times the power to the power amplifier output less losses from combiner 150.

FIGS. 2A and 2B are exploded perspective views of an example of a power amplifier, power amplifier 200. Power amplifier 200 includes a housing 210 with multiple lateral faces 220. Any number of faces 220 can be used. For example some embodiments have 4, 5, 6, 8, 10, or 12 faces 220. On some of the faces 220 is a sub-amplifier module 230. As shown in FIG. 2A, each of the sub-amplifier modules 230 are connected to a power amplifier input 240 via an input electrical path 250 on splitter 255. Similarly, as shown in FIG. 2B, each of the sub-amplifier modules 230 are connected to a power amplifier output 260 via an output electrical path 270 on combiner 275. Also shown in FIG. 2A is mounting plate 285 optionally connected to the input end of housing 210 and/or to the output end of housing 220. In certain embodiments, one face 220 has a pre-amplifier 280, and another face 220 has a power connector 290.

In some embodiments the faces 220 of the housing 210 include at least one of copper, such as copper 100, copper 101, aluminum, such as aluminum 6063, aluminum 6061, magnesium, and silver.

FIGS. 2A and 2B show the signal path from power amplifier input 240 to power amplifier output 260. The input signal is provided to power amplifier input 240, which is connected to RF splitter 255. RF splitter 255 divides the input signal power, and provides the input signal with substantially equal power and phase shift through input electrical paths 250 to each of the sub-amplifier modules 230. Each sub-amplifier module 230 is arranged on one of a plurality of substrates forming the faces 220. In some embodiments the substrate material includes at least one of molybdenum, copper tungsten, and a copper molybdenum alloy. In some embodiments, multiple sub-amplifier modules 230 are attached to a single substrate. The sub-amplifier modules 230 amplify the input signal power and drive power amplifier output 260 through output electrical paths 270 of RF combiner 275. Combiner 275 is configured to combine the outputs of the sub-amplifier modules 230 at the power amplifier output 260 with substantially equal power and phase shift.

In some embodiments, the power amplifier also includes the input pre-amp 280 positioned on one or more of the faces 220. In these embodiments, the power amplifier input 240 is connected to the pre-amp 280, and the pre-amp drives the input of the splitter 255. Pre-amp 280 receives an input signal and drives the sub-amplifier modules 230 through splitter 255. In some embodiments, pre-amp 280 functions as a buffer, presenting a small input load, and driving the larger load of the splitter 255 parasitics and the load of the sub-amplifier modules 230. In some embodiments, pre-amp 280 can perform other functions. For example, pre-amp 280 can perform processing functions, such as filtering the input signal or up-converting the input signal to, for example, an RF transmission frequency. Some embodiments do not have the pre-amp 280.

In the embodiment shown in FIGS. 2A and 2B, one face 220 has the power connector 290. Power for one or more of the sub-amplifier modules 230 and the pre-amp 280 can be provided through the power connector 290. For example, DC power of about 12 volts at about 1-5 Amps can be delivered to each of the sub-amplifier modules 230 through the power connector 290. In some embodiments, power connector 290 includes control connections which provide control signals to the sub-amplifier modules 230 and/or the pre-amp 280.

Each face 220 is connected to other faces 220 so as to form housing 210 having a central cavity. The central cavity can be used to route power signals to the sub-amplifier modules 230. In some embodiments, the central cavity is provided with circuitry used for conditioning the power signals, such as filtering and sequencing. In some embodiments, the central cavity is used to provide control signals for each of the sub-amplifier modules 230.

FIGS. 2A and 2B also show that power amplifier 200 has a mounting plate 285 on the input end of power amplifier 200. Other embodiments have a mounting plate 285 on both ends while still other embodiments have mounting plates 285 on both the input end and the output end of power amplifier 200. The mounting plate connects to housing 210 and is configured to be connected to a surface on a structure configured to receive one or more of the power amplifier 200. The structure can provide a heat management system, such as a heat sink with a fan or a liquid cooling mechanism. In some embodiments, power amplifier 200 is mounted to a heat management system with a mounting plate 285 on both the input end and the output end of power amplifier 200.

Accordingly, the heat generated by each sub-amplifier module 230 is conducted from each sub-amplifier module through the substrate to which the sub-amplifier module components are mounted, through splitter 255 and combiner 275, to mounting plate(s) 285. From mounting plates 285 the heat is conducted to the heat management system to which mounting plate(s) 285 are mounted. The heat management system provides a heat path from the mounting plate(s) 285 to the environment. In some embodiments, because of symmetry in splitter 255, housing 210, combiner 275, and mounting plate (s) 285, the heat paths from the sub-amplifier modules 230 to the environment are substantially identical. Having substantially identical heat paths is particularly advantageous because the electrical properties of sub-amplifier modules 230 and the transmission line properties of electrical input paths 250 and electrical output paths 270 are partly dependent on temperature. Accordingly, having substantially identical heat paths provides for substantially identical temperatures at each point along the signal path from power amplifier input 240 to power amplifier output 260.

In some embodiments mounting plates 285 are attached to housing 210 so as to hermetically seal the internal cavity. Various techniques for sealing can be used, such as a gasket, solder, a weld, a laser weld, and epoxy. Other sealing techniques can also be used.

In the embodiment of FIGS. 2A and 2B, because the power amplifier input 240 and the power amplifier output 260 are aligned with the same face 220, the power amplifier input 240 and the power amplifier output 260 have substantially the same orientation with respect to the remainder of the power amplifier 200. In some embodiments the power amplifier input 240 and the power amplifier output 260 do not have the same orientation with respect to the remainder of the power amplifier 200, and can have substantially opposite orientation, where the power amplifier input 240 is aligned with a first face 220, and the power amplifier output 260 is aligned with an opposite face. Other arrangements are also possible.

In some embodiments with 8 sub-amplifier modules, the maximum phase difference between the various signal paths from power amplifier input 240 to power amplifier output 260 is less than about 5 degrees at 18 GHz. In some embodiments with 8 sub-amplifier modules, the difference is less than about 2 degrees at 18 GHz.

The following table shows actual performance data of an embodiment driving a 50 Ohm load.

| Signal Frequency (GHz) | Input Power$_{sat}$ (dBm) | Output Power$_{sat}$ (dBm) | Input Power$_{1\,dB}$ (dBm) | Output Power$_{1\,dB}$ (dBm) | Gain$_{1\,dB}$ (dB) |
|---|---|---|---|---|---|
| 6  | 28.7 | 47.0 | 24.3 | 45.4 | 20.9 |
| 7  | 28.5 | 45.9 | 23.7 | 43.5 | 20.5 |
| 8  | 29.2 | 45.2 | 24.5 | 43.6 | 19.1 |
| 9  | 28.6 | 46.9 | 26.0 | 46.5 | 21.1 |
| 10 | 28.2 | 47.4 | 26.0 | 47.1 | 23.5 |
| 11 | 31.3 | 47.7 | 27.5 | 47.0 | 22.2 |
| 12 | 31.4 | 47.2 | 19.5 | 46.9 | 20.3 |
| 13 | 31.0 | 46.4 | 30.0 | 46.0 | 19.4 |
| 14 | 28.5 | 45.5 | 2737 | 44.7 | 20.3 |
| 15 | 27.9 | 46.0 | 27.4 | 45.7 | 22.2 |
| 16 | 27.9 | 46.0 | 27.4 | 45.8 | 22.3 |
| 17 | 27.3 | 44.9 | 27.6 | 44.6 | 21.0 |
| 18 | 26.7 | 44.4 | 26.0 | 44.1 | 21.9 | where:

Input Power$_{sat}$ is the power of the input signal such that the output of the amplifier is saturated (i.e. at a maximum);

Output Power$_{sat}$ is the power of the output signal of the amplifier when saturated (i.e. at a maximum);

Input Power$_{1\,dB}$ is the power of the input signal such that the output of the amplifier is 1 dB down from where it would be if the amplifier was performing with small signal gain;

Output Power$_{1\,dB}$ is the power of the output signal of the amplifier 1 dB down from where it would be if the amplifier was performing with small signal gain; and Gain$_{1\,dB}$ is the Gain when the power of the output signal of the amplifier is 1 dB down from where it would be if the amplifier was performing with small signal gain.

Figure 3B:
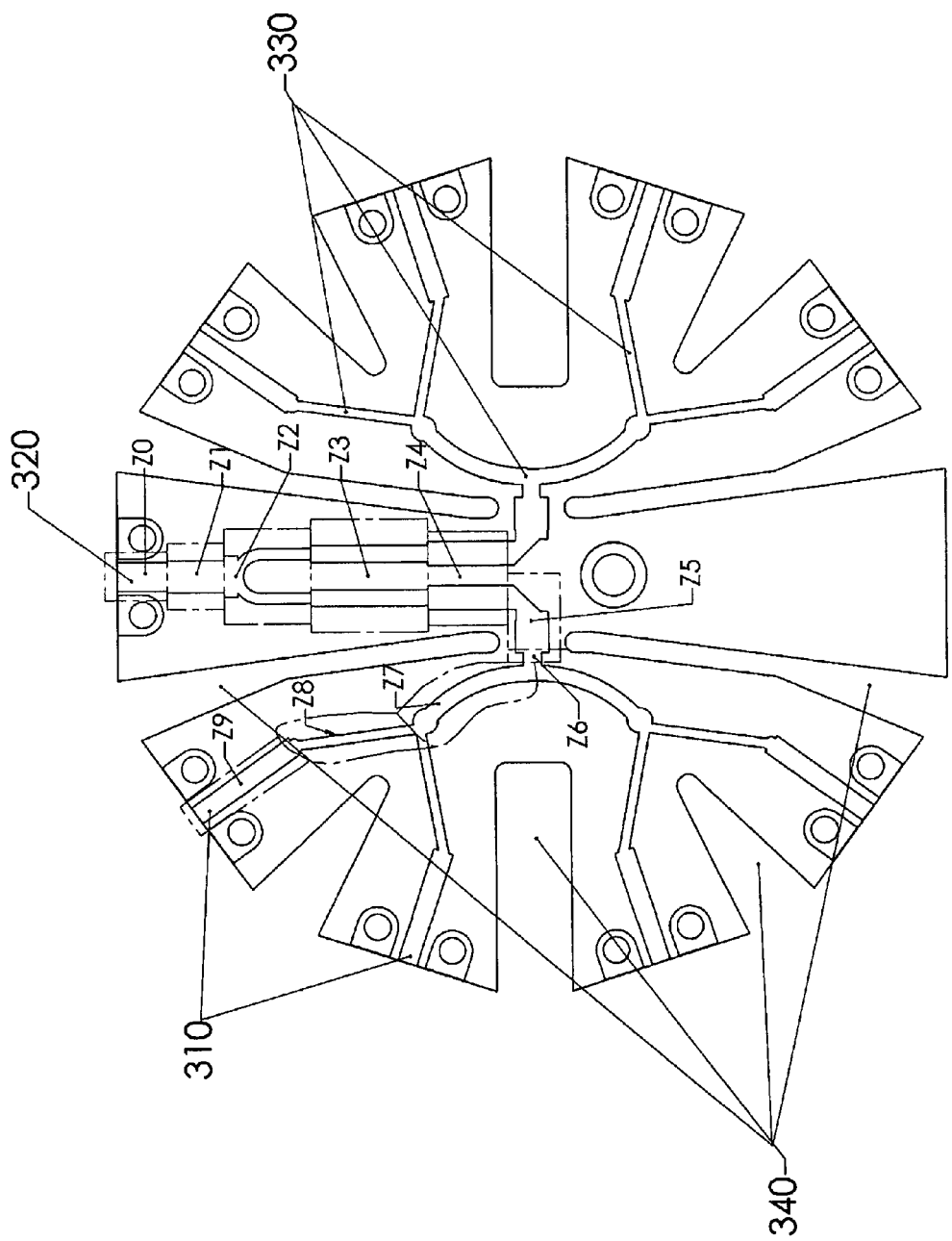
FIG. 3 is a perspective view of an embodiment of a combiner/splitter.

FIG. 3 is a perspective view of an embodiment of a component 300. The structure and features of component 300 apply symmetrically to its use as either an RF combiner or an RF splitter. For ease of discussion component 300 will be described as a combiner 300, however, the features discussed regarding combiner 300 can be applied to a splitter having the same structure by exchanging the function of the input and the output.

Combiner 300 has a plurality of inputs 310 which are connected to a single output 320 via a plurality of electrical paths 330. Each of the electrical paths 330 is shielded by at least one sidewall 340 on each side of the electrical input path 330.

Each of the inputs 310 can be driven by a separate driver. Combiner 300 combines the input power from each of the inputs 310 at the output 320, where the powers of all of the inputs 310 are combined by vector addition. Each of the inputs 310 are connected to the output 320 through an electrical path 330. In order to minimize loss in combiner 300, the electrical paths 330 are electrically substantially identical so as to avoid combining signals of various phase and amplitude at the output. Accordingly, the parasitic capacitance, inductance, and resistance of each of the electrical paths 330 are substantially identical, and the transmission line characteristics of the electrical paths 330 are substantially identical.

The combiner 300 having electrically substantially identical electrical paths 330 is achieved in part by forming electrical paths 330 such that they are physically substantially identical. As shown in FIG. 3, although there are variations in symmetry, electrical paths 330 are physically substantially the same length, and, as electrical properties are substantially independent of the symmetry variations, electrical paths 330 are electrically substantially identical in construction. So as to provide advantageous connections to components driving the inputs 310 and to one or more components at the output 320, the inputs 310, the electrical paths 330, and the output 320 are substantially in the same plane. The planar nature of the combiner allows for convenient low-loss connections to both inputs and output. This is especially advantageous when the transmission lines from the input components and/or the output component are configured to be connected to the combiner 300 in substantially the same plane as the inputs 310 and the output 320.

As shown in FIG. 3, in one embodiment, the electrical paths from each of the inputs 310 to the output 320 have various features. These features are manufactured to insure that the various paths are substantially identical, and provide desired impedance of each of the paths. As may be seen, one path is labeled with sections Z0 to Z9. The electrical paths of sections Z0 through Z4 form a two way combiner. The electrical path within section Z5 forms an e-field compensator. Section Z7 has a circular current spreader.

The electrical paths within sections Z0 through Z4 form a two way combiner, which combines the signals from the center of the combiner 300 and bring them to the output 320. In some embodiments, the same or a similar structure may be used to combine the inputs and bring them to the center of the combiner 300. However, as shown, this may be accomplished by the features shown in sections Z9 through Z5.

Section Z5 has an e-field compensator. Such a compensator effectively compensates for the RF imbalance which occurs due to the change in direction that the current experiences in going from section Z6 through Z5 to Z4. The electrical path within section Z5 balances the electric fields and the current as it is conducted from section Z6 through Z5 to Z4. The electrical path of section Z5 causes the current in sections Z7 through Z4 to be substantially equal.

Section Z7 has a circular current spreader. The circular spreader has the effect of spreading the current as it enters the circle, making it easier for the current to combine equally from each of the section Z8 branches.

A second aspect which helps to achieve electrically substantially identical electrical paths 330 is that each of the electrical paths 330 is shielded by at least one sidewall 340 on each side of the electrical input path 330. As shown in FIG. 3, combiner 300 includes sidewalls 340 which form channels within which the electrical paths 330 are routed. The sidewalls 340 are formed such that the parasitic capacitances between each electrical path 330 and the adjacent sidewalls 340 are substantially identical to the parasitic capacitances between each of the other electrical paths 330 and the adjacent sidewalls 340. In certain embodiments, the transmission line characteristics of the electrical input path 330 are advantageously affected when the sidewalls 340 are positioned so as to be less than ¼ wavelength from the electrical input path 330.

Because the combiner 300 is symmetric about a line from the output 320 through the center, when connected to a power amplifier such as that shown in FIGS. 2A and 2B, the direction of the output 320 can be one of two optional opposite orientations. Accordingly, when the power amplifier has a combiner 300 at the output, and a similar structure as a splitter at the input, the input and output can have substantially identical or substantially opposite orientation.

The embodiment of FIG. 3 has eight electrical paths 330 and one output 320. Other embodiments have other configurations. For example, some embodiments have four or another number of electrical paths 330. Some embodiments have more than one output 320. At each junction of electrical paths 330 in the embodiment of FIG. 3, two electrical paths 330 combine. In other embodiments, three or more electrical paths 330 combine at some or all junctions.

Figure 4:
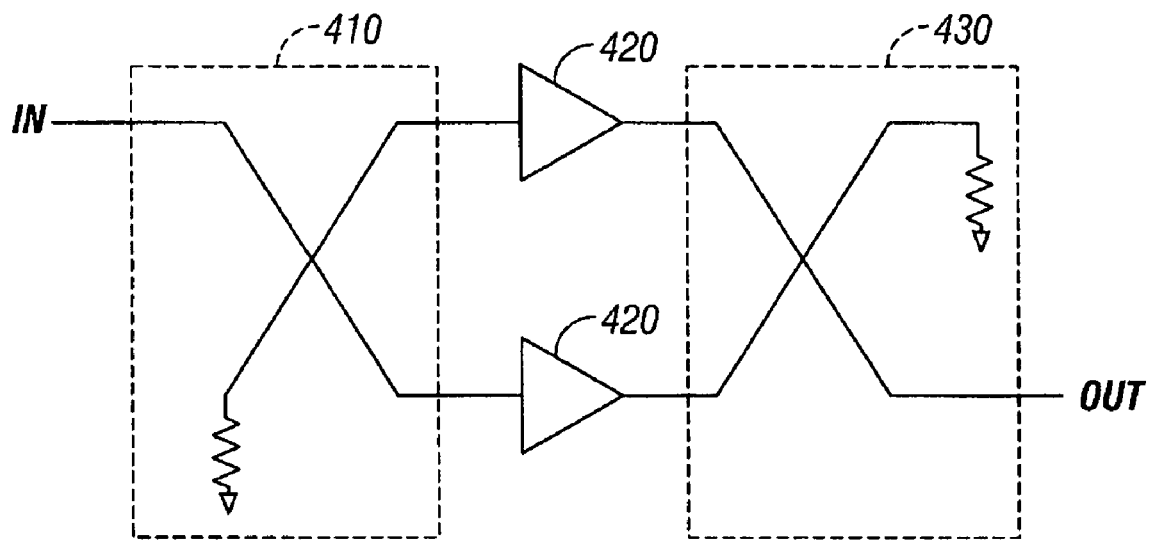
FIG. 4 is a schematic diagram of an example of one embodiment of a sub-amplifier module.

FIG. 4 is a schematic diagram of an example of a sub-amplifier module. Sub-amplifier module 400 has an input splitter 410, two sub-amplifiers 420, and an output combiner 430.

In one embodiment, input splitter 410 and output combiner 430 each include a hybrid combiner network. Other embodiments use other combiner and/or splitter structures. An advantageous aspect of the hybrid combiner network is that the input and output impedance load of the sub-amplifier module 400 does not depend on the condition of the sub-amplifiers 420. When a number of sub-amplifier modules are connected to an input splitter and/or an output combiner, such as in the power amplifier 200 of FIGS. 2A and 2B, if the input or output load of one of the sub-amplifier modules significantly changes, significant reflections and/or oscillations can occur. In addition to losses causing a drop in power efficiency and a drop in VSWR performance, when the reflections and/or oscillations are significant enough, the sub-amplifiers can be damaged. Such damage can cause further changes in input and/or output impedance, which can further cause reflections and/or oscillations which can cause further damage to other sub-amplifiers. The result can be that some or all of the amplifiers become inoperable. This situation is substantially avoided by using a hybrid combiner. Because the sub-amplifier module 400 presents a load dependent on the passive devices of the hybrid combiner, rather than the active sub-amplifiers 420, if a sub-amplifier 420 in one sub-amplifier module becomes damaged, the load of the damaged sub-amplifier module presented to the other sub-amplifier modules remains substantially unchanged. As a result, the other sub-amplifiers remain substantially remain unaffected, and the power amplifier continues to function.

The sub-amplifiers 420 can be any RF amplifying devices configured for use in such an application. For example, in one embodiment sub-amplifier 420 is a GaAs MMIC such as a TGA2501-EPU available from TriQuint Semiconductor, Inc. In some embodiments, the sub-amplifiers 420 are substantially identical. In certain embodiments the sub-amplifiers 420 each include an input used to adjust electrical characteristics of the sub-amplifiers 420, such as gain and bandwidth. In some embodiments, the input provides a gate bias voltage for the sub-amplifier 420, for example a negative gate bias voltage of about −0.7 volts DC can be provided to a GaAs sub-amplifier.

Flexible transmission lines can be used to electrically connect the splitter 255 to the sub-amplifier modules 230 and electrically connect the sub-amplifier modules 230 and the combiner 275 of FIGS. 2A and 2B. A transmission line for such use is shown in FIGS. 5A and 5B, which are illustrations of perspective views of an example of a flexible transmission line. Transmission line 500 includes a flexible substrate 510, a conductor 520, and screw holes 530.

The flexible substrate 510 and conductor 520 are configured to provide an insertion loss of less than about 0.2 dB when the flexible substrate is bent about 90 degrees with a radius of curvature less than about ⅛ inch. In some embodiments the material used can be Teflon coated copper double clad duriod laminate similar to Rogers R/flex 3000 The material is bent with the grain of the material in order to provide a bend that is flexible and will not break with expansion or vibration.

The screw holes 530 are configured to be used to secure the flexible transmission line 500 to one or more substrates. A connection 550 between transmission line 500 and a substrate 540 is shown in FIG. 5C. Connection 550 includes a first connector 552 which has screws 555 securing and electrically connecting the transmission line 500 to the substrate 540, and a second connector 554 securing and electrically connecting conductor 520 to a conductor 560 associated with substrate 540. The second connector 554 can include a conductor that is attached to conductors 520 and 560 by various mechanisms, such as, but not limited to a weld or with solder.

In some embodiments, connection 550 provides a substantially coplanar interface between conductors 520 and 560. This is advantageous as reflections at the junction between conductors 520 and 560 are reduced because of the coplanar geometry.

In some embodiments connection 550 provides an electrical matching network between conductors 520 and 560. In such embodiments, screws 555 are conductive and contact a ground signal. Accordingly a parasitic capacitance is formed between the screws 555 and the conductors 520 and 560. The parasitic capacitance and the inherent inductance of the second connector 554 collectively provide a matching network.

FIG. 5D is a schematic diagram illustrating the matching network. The matching network has a series inductance 556 from the second connector 554, parallel capacitance 557 from the first connector 552 to the second connector 554 and to conductors 520 and 560, and inductances 558 to ground. The matching network can be tuned by design. The characteristics of the matching network are determined at least in part by the dimensions of second connector 554, the spacing between the first connector 552 and second connector 554, and the spacing between the first connector 552 and the conductors 520 and 560. In some embodiments the inductance of the second connector 554 is less than about 0.05 nH. In some embodiments the remaining two inductors 558 are approximately 0.002 nH. The overall output impedance is 50 ohms.

Referring again to FIGS. 2A and 2B, power amplifier 200 can include an RF splitter 255 and RF combiner 275 such as the combiner 300 described above with reference to FIG. 3. Power amplifier 200 can also include sub-amplifier modules such as sub-amplifier module 400 described above with reference to FIG. 4. Power amplifier 200 can further include flexible transmission lines such as flexible transmission line 500 described above with reference to FIG. 5.

As described above, some embodiments include a central cavity. The central cavity can be used to route power signals to the sub-amplifier modules 230.

In some embodiments the central cavity is provided with circuitry used for conditioning the power signals, such as filtering and sequencing. For example, some embodiments of sub-amplifier modules 230 require that the power signals turn on and turn off in a specified sequence. Circuitry which provides power supply sequencing can be positioned within the cavity. For example, a MAX881REUB from Maxim Integrated Products can be used. In some embodiments the circuit provides power supply sequencing for all of the sub-amplifier modules 230. In some embodiments, each sub-amplifier module 230 has a dedicated power sequencing circuit. The dedicated power sequencing circuit is configured to monitor the application of the various power signals and to apply the power signals to the corresponding sub-amplifier module 230 in the proper sequence. In such embodiments, the dedicated power sequencing circuit can be positioned within the cavity on the internal surface of the face 220 on which the corresponding sub-amplifier module 230 is positioned. The dedicated power sequencing circuit can be produced on a PCB, which is subsequently mounted on the internal surface or opposite side of the face 220 on which the corresponding sub-amplifier module 230 is positioned.

In some embodiments the central cavity is similarly used to provide power conditioning for each of the sub-amplifier modules 230. Various power line filters and regulators can be positioned in the cavity to provide clean power to the sub-amplifier modules 230 collectively or individually.

In some embodiments the central cavity is used to provide control signals for each of the sub-amplifier modules 230. Some sub-amplifier modules 230 have adjustable amplification characteristics, such as gain and bandwidth. The control signals for such adjustment can be provided within the cavity to the sub-amplifier modules 230 collectively or individually. For some sub-amplifier modules 230, the control signals include a gate bias voltage signal.

In some embodiments the electrical connection between the power sequencing circuit, the power conditioning circuitry, and/or the control signals and the corresponding sub-amplifier module 230 is provided by a screw or other conductive securing element, by which the circuit PCB is mounted to the housing 210. For example, on the cavity side, the screw can be configured to hold the PCB to the housing 210 and to be electrically connected to a power signal output of the sequencing or conditioning circuit, with, for example, a bond wire. The screw extends through a portion of the housing 210, and electrically connects to the sub-amplifier module 230 with, for example, a second bond wire. In such embodiments, the screw or other attachment functions as a via. In some embodiments, the screw has an external surface which includes an electrically non-conductive material, such as plastic or nylon to cover all or a part of the external surface. In some embodiments, the entire screw is conductive, and the screw hole in the housing and the PCB are either non-conductive or otherwise provided with electrical isolation.

Such a screw or securing element can, in general, be used to mechanically attach and electrically connect other electronic components to one another. For example a PCB in a system can be mechanically attached to the rest of the system with securing elements which provide an electrical connection for the PCB to a ground plane.

In some embodiments, the securing element includes a filter to electrically condition the signal.

Figure 6:
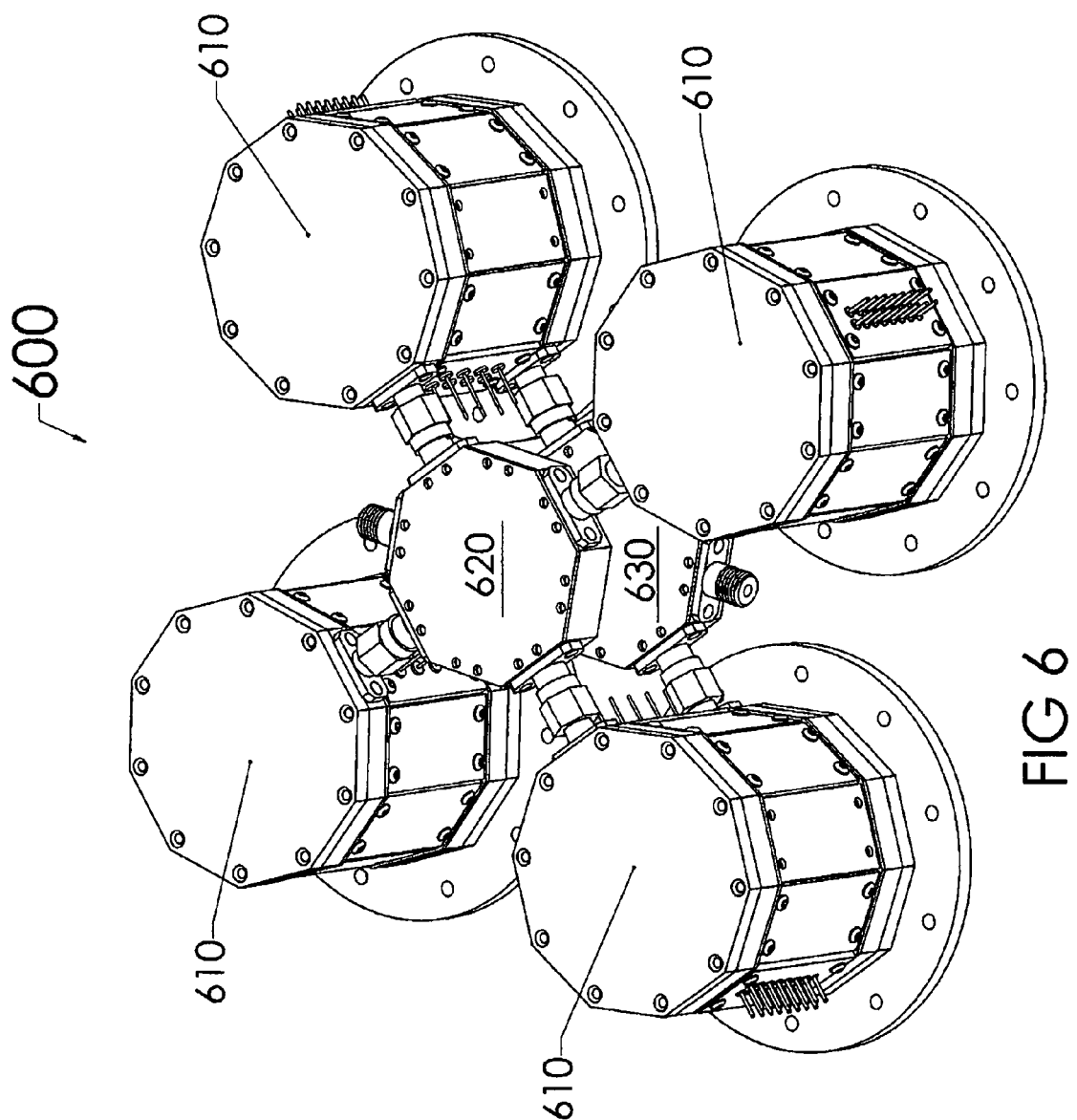
FIG. 6 is a diagram showing a perspective view of one embodiment of a combined power amplifier having four power amplifiers.

FIG. 6 is a diagram showing a perspective view of an example of a combined power amplifier having four power amplifiers 610, such as the power amplifier 200 shown in FIGS. 2A and 2B. As shown, the four power amplifiers 610 are connected with a combiner 620 and a splitter 630. In some embodiments, power amplifiers 610 have one or more of the power amplifier aspects described above. Similarly, combiner 620 and splitter 630 can have one or more of the combiner aspects described above.

Power amplifiers 610 are each arranged such that the input connector and output connector of each power amplifier 610 is oriented toward a point central to the four power amplifiers 610. Accordingly, each of the input connectors can conveniently be connected to the central splitter 630. Similarly, each of the output connectors can conveniently be connected to the central combiner 630. As a result, the four power amplifiers 610 are electrically connected in parallel, and the power amplification of the combined power amplifier 600 is approximately four times that of each power amplifier 610 alone.

In other embodiments, other numbers of power amplifiers 610 are used. For example, in some embodiments two power amplifiers 610 are used, and the splitter 630 and combiner 620 are configured for two power amplifiers 610. In some embodiments more than four power amplifiers 610 are used. In some embodiments an odd number of power amplifiers are used. In some embodiments, two or more combined power amplifiers 600 are connected by yet another combiner and another splitter (not shown).

In order to achieve similar results, the combiner 620 and the splitter 630 have similar features as the combiner 300 described above with reference to FIG. 3. In some embodiments the combiner 620 and the splitter 630 may be configured for higher power than the combiner 300.

Figure 7:
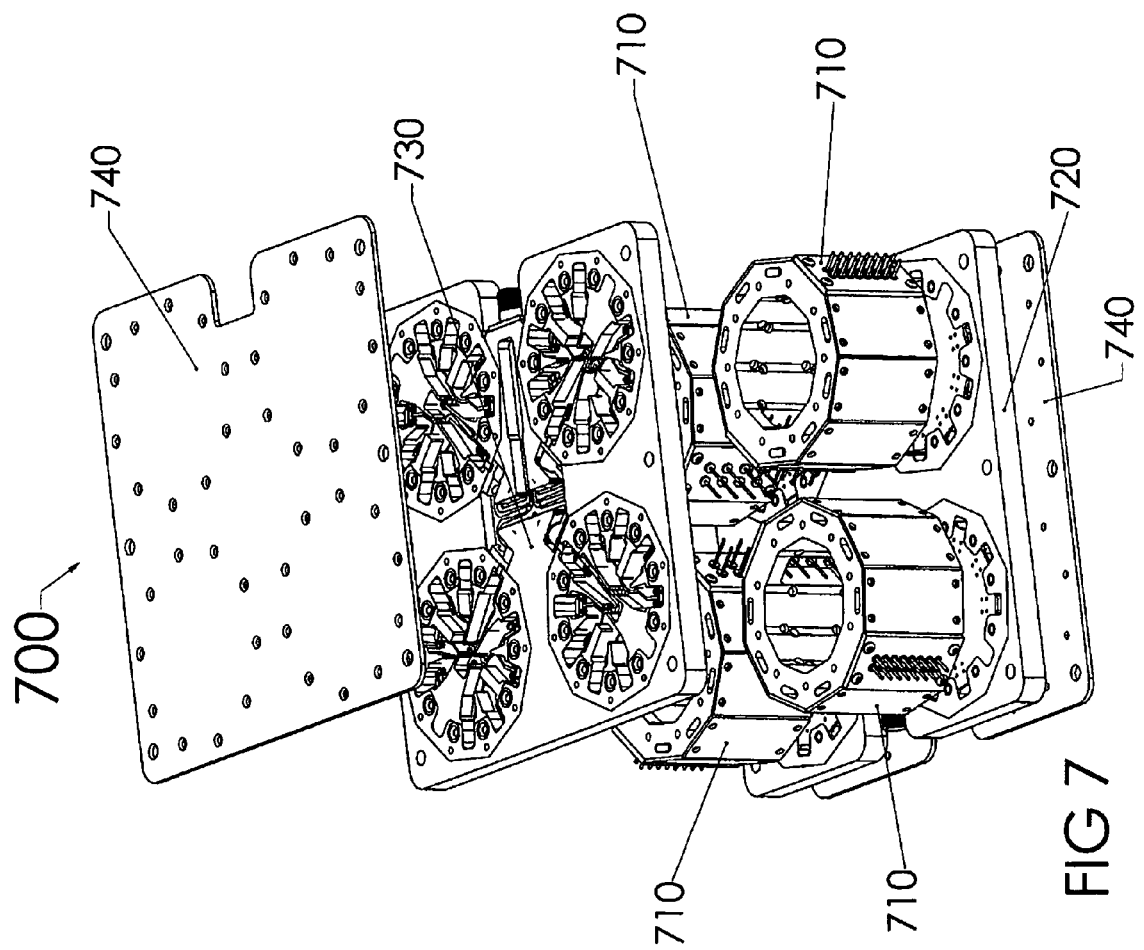
FIG. 7 is a diagram showing an exploded perspective view of one embodiment of a combined power amplifier 700 having four power amplifiers.

FIG. 7 is an exploded perspective view of a combined power amplifier 700 having four power amplifiers 710 connected with a combiner 720, a splitter 730, and plates 740. In some embodiments power amplifiers 710 have one or more of the power amplifier aspects described above. Similarly, combiner 720 and splitter 730 can have one or more of the combiner aspects described above. In some embodiments the combiner 720 and the splitter 730 may be configured for higher power than the combiner 300.

In the embodiment shown in FIG. 7, power amplifiers 710 are arranged close to one another so as to reduce conductor lengths. The combiner 720 and the splitter 730 are configured to combine/split the signals for all of the sub-amplifier modules of the power amplifiers 710. In one embodiment, combiner 720 and splitter 730 are configured to combine/split signals for 32 sub-amplifier modules. Other embodiments are configured for other numbers of sub-amplifier modules. In addition, combiner 720 and splitter 730 provide an integrated path from the sub-amplifier modules to the input or the output of the combined power amplifier 700, removing the need for, and loss which occurs with connectors.

Some embodiments of the combined power amplifier 700 can be configured to output a signal of about 4 GHz to about 40 GHz frequency and power of at least about 30 Watts.

Figure 8:
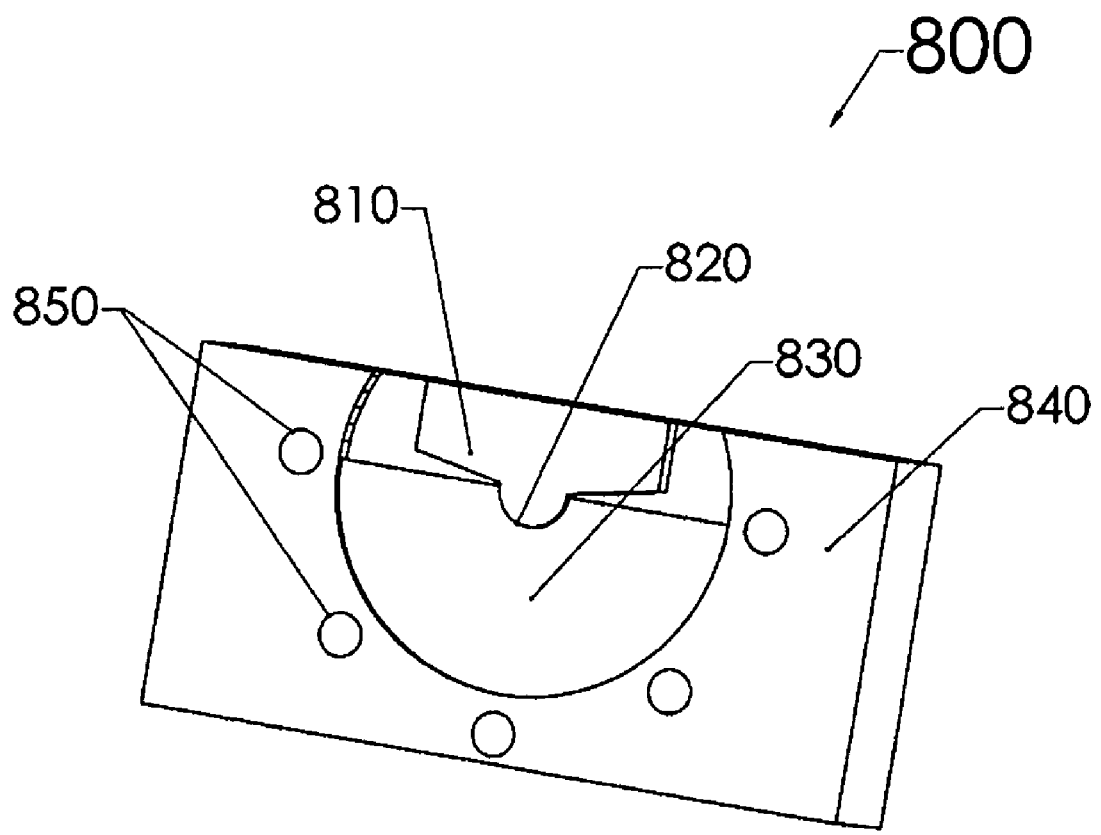
FIG. 8 is a diagram showing a perspective view of an example of an RF load.

For terminating transmission lines at RF devices, a load resistor may be placed at the connection of the transmission line to the RF device. For example, the hybrid combiner 410 of FIG. 4 requires a resistor termination load. FIG. 8 is a diagram showing a perspective view of an example of an RF load for such an application. The RF load 800 is substantially planar and has relatively high surface area over which the resistive material is spread, allowing for effective heat transfer and minimal hot spot generation in the resistive material. Accordingly, RF load 800 is capable of operating under high power and high frequency conditions. For example, some embodiments present a substantially constant 50 Ohm impedance at frequencies up to about 20 GHz with a signal of about 100 watts. RF load 800 has connector 810, interface 820, load resistor 830 and ground terminal 840, which has holes 850 which can be used to attach the RF load 800 to a substrate.

Connector 810 is formed with a conductive material, such as gold Connector 810 functions as a signal terminal of the RF load, may be connected to a signal transmission line, such as an input or an output of the combiner 300 of FIG. 3. Interface 820 is also formed of a conductive material, such as gold and contacts load resistor 830 at the perimeter of the semicircle. Load resistor 830 is formed of an electrically resistive material, such as tungsten. Load resistor 830 contacts the ground terminal 840 at the outer perimeter of the load resistor semicircle. The substantially circular nature of load resistor 830 provides a large surface which provides for wide bandwidth and high frequency operation, as well as advantageous heat conductance performance. Ground terminal 840 is connected to a system ground. In some embodiments the holes 850 may be used to attach the RF load 800 to a housing, such as housing 210 of FIG. 2, which may be a system ground. The underside (not shown) of RF load 800 may comprise a conductive coating for soldering, and for conducting the system ground at the attachment to the ground terminal 840. Holes 850 may provide pathways for conductive vias connecting the system ground to the ground terminal.

Figure 9:
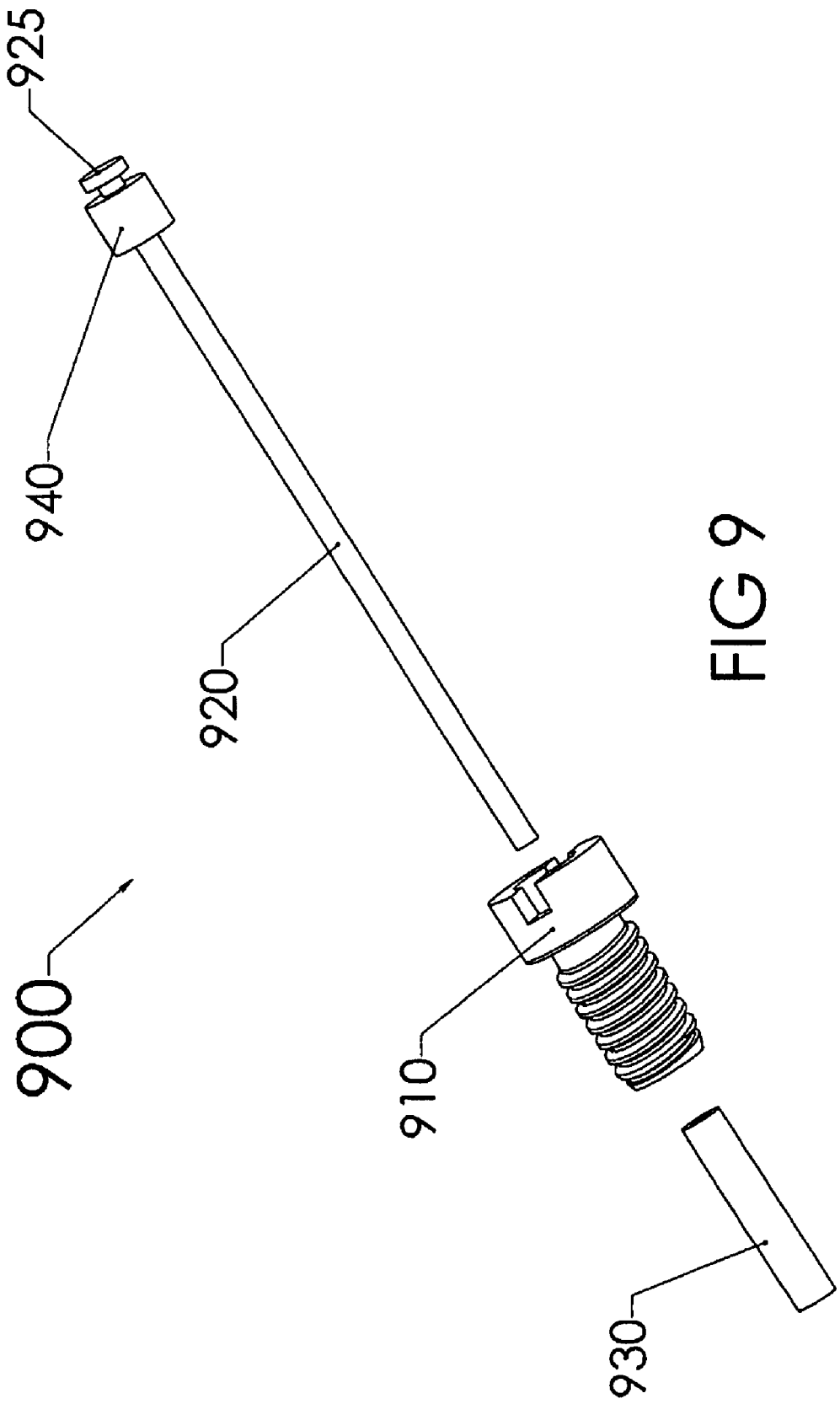
FIG. 9 is a diagram showing a perspective view of an example of an attachment device.

FIG. 9 is a perspective view of attachment device 900 which is an embodiment of an attachment for an electrical component. Such an attachment device 900 may be used to secure the sub-amplifier modules 230 of FIG. 2 to the substrates of the power amplifier 200. In this application the attachment device 900 acts as a mechanical attachment, an electrical via, and an electrical filter.

The attachment device 900 comprises threaded securing element 910, conductor 920, insulator 930, and seal 940. When assembled, insulator 930 is inside a cavity in the securing element 910, and conductor 920 extends through insulator 930 such that conductor head 925 is exposed on one side of securing element 910 and the opposite end of conductor 920 is exposed on the other side of securing element 910.

In the embodiment of FIG. 9, one end of conductor 920 has a head 925, which is configured to have a flat surface. The flat surface can be configured to be electrically connected to an electrical component through a wire bonded to the flat surface. The other end of conductor 920 is configured as a pin which can be inserted into a socket so as to make an electrical connection to another or the same electrical component. In other embodiments, either or both ends of conductor 920 can be configured to make electrical connections to one or more electronic components using any connection mechanism. For example, one or both ends may comprise a socket, or a solder bump. Other mechanisms can also be used.

In some embodiments, seal 940 forms a hermetic seal such that the cavity in securing element 910 is sealed. In some embodiments, seal 940 comprises a glass to metal seal.

If securing element 910 is conductive, a capacitor is formed between conductor 920 and securing element 910. The capacitance of the capacitor can be designed through dimensions of seal 940. A smaller seal 940 will result in a larger capacitance. The material of seal 940 may also be adjusted to affect the capacitance. The capacitance of the capacitor can also be designed through various dimensions of conductor 920, of securing element 910, and of insulator 930. For example, if conductor 920 and securing element 910 are longer, the capacitance between them is increased. Also, if conductor 920 is thicker and insulator 930 is thinner, the capacitance is greater. Other variations may also be made. The dielectric material of insulator 930 may also be adjusted to affect the capacitance. In some embodiments insulator 930 may be covered on either the inside or the outside or both with a conductive material, such as gold, to better control the dielectric between the conductive plates of the capacitor.

Through variations in at least one of the dimensions, the material, and the construction of conductor 920, the inductance and resistance of conductor 920 can be tuned. For example, a thinner conductor 920 will have higher inductance and higher resistance.

Also, in some embodiments, attachment device 900 can be configured so as to receive an inductance increasing element. For example, insulator 930 can extend beyond either or both ends of securing element 910, such that a ferrite bead can be placed over it.

Because of the inductance, resistance, and capacitance, attachment device 900 filters electrical signals passing through it. The filtering characteristics of attachment device 900 can be tuned by adjusting the inductance, resistance, and capacitance as described above.

While specific blocks, sections, devices, functions and modules may have been set forth above, a skilled technologist will realize that there are many ways to partition the system, and that there are many parts, components, modules or functions that may be substituted for those listed above.

While the above detailed description has shown, described, and pointed out novel features as applied to various embodiments, it will be understood that various omissions, substitutions, and changes in the form and details of the device or process illustrated can be made by those skilled in the art without departing from the spirit of the invention. As will be recognized, the present invention can be embodied within a form that does not provide all of the features and benefits set forth herein, as some features can be used or practiced separately from others.

What is claimed is:

1. An attachment device for an amplifier formed from a plurality of sub-amplifiers, the device comprising:
    a threaded securing element configured to mechanically attach one of the sub-amplifiers to the amplifier; and
    a first electrical conductor configured to provide an electrical connection from the amplifier to the sub-amplifier, wherein the first electrical conductor and the securing element collectively form, at least in part, a via and a tuned filter for the sub-amplifier.

2. The device of claim 1, wherein the securing element comprises a screw.

3. The device of claim 1, wherein the securing element is electrically insulated from the first electrical conductor.

4. The device of claim 1, wherein the securing element comprises a second electrical conductor.

5. The device of claim 1, wherein the characteristics of the electrical filter are tuned through design of the first electrical conductor.

6. The device of claim 1, wherein the first electrical conductor comprises a surface configured to receive a wire bond.

7. The device of claim 1, wherein the first electrical conductor is configured to be inserted into a socket.

8. The device of claim 1, wherein the first electrical conductor comprises a pin.

9. The device of claim 1, wherein the device forms a hermetic seal.

10. The device of claim 1, further configured to receive an inductance increasing element.

11. The device of claim 1, wherein the characteristics of the electrical filter are tuned through design of at least one of an inductance, a resistance and a capacitance of at least one of the conductor and the securing element.

12. The device of claim 1, further comprising an insulator configured to substantially prevent an electrical connection between the first conductor and at least one of the securing element, the amplifier and the sub-amplifier.

13. The device of claim 12, wherein the insulator comprises a conductive surface.

14. The device of claim 1, wherein the sub-amplifier comprises at least two substantially parallel sub-amplifier modules, and the amplifier comprises an RF input connection and an RF output connection, and wherein the RF input connection, and the RF output connection are substantially perpendicular to the sub-amplifier modules.

15. The device of claim 14, wherein the amplifier further comprises an RF combiner, wherein the RF combiner comprises:
    a plurality of RF input signal paths;
    at least one RF output signal path, wherein the output signal path and each of the plurality of input signal paths are positioned substantially within a plane; and
    a plurality of sidewalls, wherein each input signal path is positioned between at least two sidewalls, and the sidewalls and the plurality of input signal paths are configured such that each of the input paths are physically and electrically substantially identical.

16. The device of claim 14, wherein the amplifier further comprises an RF load comprising:
    a resistive material; and
    first and second terminals, each comprising a curved interface to the resistive material.

17. The device of claim 14, wherein the amplifier further comprises a plurality of sub-amplifiers, each having an input and an output, wherein the inputs of the sub-amplifiers are electrically connected to each other with an RF splitter, and each of the outputs of the sub-amplifiers are electrically connected to each other with an RF combiner.

* * * * *